(12) United States Patent
Tang

(10) Patent No.: US 6,337,787 B2
(45) Date of Patent: Jan. 8, 2002

(54) GATE-VOLTAGE CONTROLLED ELECTROSTATIC DISCHARGE PROTECTION CIRCUIT

(75) Inventor: Tien-Hao Tang, Chungho (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/240,902

(22) Filed: Jan. 29, 1999

(30) Foreign Application Priority Data

Mar. 25, 1998 (TW) .......................... 87104445

(51) Int. Cl.[7] ................................. H02H 9/00
(52) U.S. Cl. ........................ 361/56; 361/111
(58) Field of Search ............................ 361/54, 56, 111, 361/91.1, 91.5; 257/173, 355, 357; 327/306, 309, 210

(56) References Cited

U.S. PATENT DOCUMENTS

| | | | | |
|---|---|---|---|---|
| 5,559,659 A | * | 9/1996 | Strauss | 361/56 |
| 5,594,611 A | * | 1/1997 | Consiglio et al. | 361/118 |
| 5,617,283 A | * | 4/1997 | Krakauer et al. | 361/56 |
| 5,625,280 A | * | 4/1997 | Voldman | 323/284 |
| 5,644,459 A | * | 7/1997 | Lien | 361/56 |
| 5,852,541 A | * | 12/1998 | Lin et al. | 361/111 |
| 5,910,874 A | * | 6/1999 | Iniewski et al. | 361/56 |

OTHER PUBLICATIONS

M.S. Ghaus:, Electronic Devices and Circuits, pp. 142 and 148, 152, 1985.*#jf139##

*Primary Examiner*—Kim Huynh

(57) ABSTRACT

A gate-voltage controlled ESD protection circuit is provided, which is designed to couple between an input port and an IC device having an inverter coupled to the internal circuit of the IC device for the purpose of protecting the IC device against ESD stress. The first potential drop subcircuit is capable of allowing the PMOS transistor to be immediately switched into the conductive state in the event that a negative ESD voltage of a large magnitude is being applied to the input port. Similarly, the second potential drop subcircuit is capable of allowing the NMOS transistor to be immediately switched into the conductive state in the event that a positive ESD voltage of a large magnitude is being applied to the input port. The characteristic structure of the ESD protection circuit can help the PMOS and NMOS transistors in the ESD protection circuit to provide the desired ESD protection without being affected by breakdown of the thin oxide layer in the inverter, as in the prior art.

8 Claims, 2 Drawing Sheets

GATE-VOLTAGE CONTROLLED ELECTROSTATIC DISCHARGE PROTECTION CIRCUIT

CROSS-REFERENCE TO RELATED APPLICATION

This application claims the priority benefit of Taiwan application serial no. 87104445, filed Mar. 25, 1998, the full disclosure of which is incorporated herein by reference.

BACKGROUND OF THE INVENTION

1. Field of the Invention

This invention relates to electrostatic discharge (ESD) protection circuits, and more particularly, to a gate-voltage controlled ESD protection circuit for use in an integrated circuit (IC) device for the purpose of protecting the internal circuit of the IC device against ESD stress.

2. Description of Related Art

In the fabrication of semiconductor IC devices, electrostatic discharge (ESD) is a major problem that can cause damage to the internal circuit of the IC device. One solution to this problem is to incorporate an on-chip ESD protection circuit on the input/output (I/O) pads of CMOS (complementary metal-oxide semiconductor) devices. However, as semiconductor fabrication technologies have advanced to the deep-submicron level, the conventional ESD protection circuit is no longer able to provide adequate ESD robustness. This problem will be illustratively depicted in the following with reference to FIGS. 1–2.

FIG. 1 is a schematic diagram of a conventional ESD protection circuit. As shown, this conventional ESD protection circuit is connected to an input pad (IP) 12 and includes a field oxide device (FOD) F1, an NMOS (N-type metal-oxide semiconductor) transistor N1, a resistor R1, and an inverter 10. The NMOS transistor N1 is connected in such a manner that its gate is connected to the ground power line $V_{SS}$ (thus referred to as a gate-grounded NMOS transistor) and is specifically designed to operate in the breakdown mode. When an ESD stress appears at the IP 12, the resulting ESD current can bypass through the gate-grounded NMOS transistor N1 to the ground power line $V_{SS}$. To allow the gate-grounded NMOS transistor N1 to provide this ESD protection effect, the breakdown voltage of the gate-grounded NMOS transistor N1 should be smaller than the breakdown voltage of the gate oxide layer in the inverter 10. In other words, the breakdown voltage of the gate-grounded NMOS transistor N1 decreases as the channel length is shortened. However, a short channel length will make the gate-grounded NMOS transistor N1 undesirably more vulnerable to ESD stress. The provision of the resistor R1 can suppress the ESD current flowing through the gate-grounded NMOS transistor N1. Moreover, the FOD F1 can help drain part of the ESD current from the IP 12 to the ground power line $V_{SS}$. The FOD F1 is preferably constructed on a non-lightly doped drain (LDD) structure, which allows the FOD F1 to be longer in channel length than the gate-grounded NMOS transistor N1 so as to be capable of withstanding larger ESD currents.

A negative ESD voltage applied to the IP 12 causes the gate-grounded NMOS transistor N1 to produce a parasite diode current. A positive ESD voltage applied to the IP 12 causes the gate-grounded NMOS transistor N1 to produce an NPN avalanche breakdown current, thus causing a large potential drop across the resistor R1. As a result of this, the FOD F1 is switched to the conductive state. If the FOD F1 is designed to be longer in channel length than the gate-grounded NMOS transistor N1, it will be also larger in breakdown voltage than the gate-grounded NMOS transistor N1. Therefore, the level of the breakdown voltage of the FOD F1 can be close or even larger than that of the gate oxide layer in the inverter 10. If the IC device is further downsized, the gate oxide layer in the inverter 10 will be correspondingly made thinner. As a result, the inverter 10 would be subjected to a breakdown voltage before the NPN or PNP conduction takes place in the ESD protection circuit. The ESD protection circuit is therefore reduced in its ESD robustness to provide adequate ESD protection to the downsized IC device.

FIG. 2 is a schematic diagram of another conventional ESD protection circuit. As shown, this conventional ESD protection circuit is connected to an input pad (IP) 22 and includes a PMOS (P-type metal-oxide semiconductor) transistor P2, an NMOS (N-type metal-oxide semiconductor) transistor N2, a resistor R2, and an inverter 20. The PMOS transistor P2 is connected in such a manner that its gate and source are connected to the system power line VDD, while the NMOS transistor N2 is connected in such a manner that its gate and source are connected to the ground power line $V_{SS}$.

A positive ESD voltage applied to the IP 22 causes the PMOS transistor P2 to produce a parasite diode current. If a negative ESD voltage is applied, it subjects the PMOS transistor P2 to a PNP avalanche breakdown current. This causes the source, drain, and substrate of the PMOS transistor P2 to be equivalently formed into a PNP structure, as indicated by the dashed box B1 in FIG. 2. If the negative ESD voltage is overly large in magnitude, it will cause an avalanche breakdown to this PNP structure B1.

On the other hand, a negative ESD voltage applied to the IP 22 causes the NMOS transistor N2 to produce a parasite diode current. However, in the event that a positive ESD voltage is applied, it subjects the NMOS transistor N2 to an NPN avalanche breakdown current. This causes the source, drain, and substrate of the NMOS transistor N2 to be equivalently formed into an NPN structure, as indicated by the dashed box B2 in FIG. 2. If the positive ESD voltage is overly large in magnitude, it will cause an avalanche breakdown to this NPN structure B2.

If the design for the IC device incorporating the foregoing ESD protection circuit of FIG. 2 is further downsized, the gate oxide layer in the inverter 20 is correspondingly made thinner. This makes the breakdown voltage of the PMOS transistor P2 and the NMOS transistor N2 close to or even greater than the breakdown voltage of the gate oxide layer in the inverter 20. As a bad consequence of this, the inverter 20 is be subjected to breakdown before the NPN or PNP structure in the ESD protection circuit is switched into the conductive state, thus causing the ESD protection circuit to fail to provide the desired ESD protection.

SUMMARY OF THE INVENTION

It is therefore an objective of the present invention to provide a gate-voltage controlled ESD protection circuit, which can help the PMOS and NMOS transistors in the ESD protection circuit provide the desired ESD protection without being affected by breakdown of the thin oxide layer in the inverter.

In accordance with the foregoing and other objectives of the present invention, a gate-voltage controlled ESD protection circuit is provided. The ESD protection circuit of the invention is coupled between an IP and an IC device having an inverter coupled to the internal circuit for the purpose of protecting the IC device against ESD stress. The ESD protection circuit comprises a resistor, a PMOS transistor, a first potential drop subcircuit, an NMOS transistor, and a second potential drop subcircuit. The resistor has a first end connected to a common node connected to the IP and a second end connected to the input end of the inverter. The PMOS transistor has its source connected to a first power line and drain connected to the common node. The first potential drop subcircuit has a positive end connected to the gate of the PMOS transistor and a negative end connected to the common node, which can be turned into conductive state when a negative ESD voltage lower in magnitude than a predetermined level is applied to the IP, causing the PMOS transistor to be switched into conductive state. The NMOS transistor has its source connected to a second power line and its drain connected to the common node. The second potential drop subcircuit has a positive end connected to the common node and a negative end connected to the gate of NMOS transistor, and which can be switched to the conductive state when a positive ESD voltage higher in magnitude than a predetermined level is applied to the IP, causing the NMOS transistor to be switched into conductive state.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1:
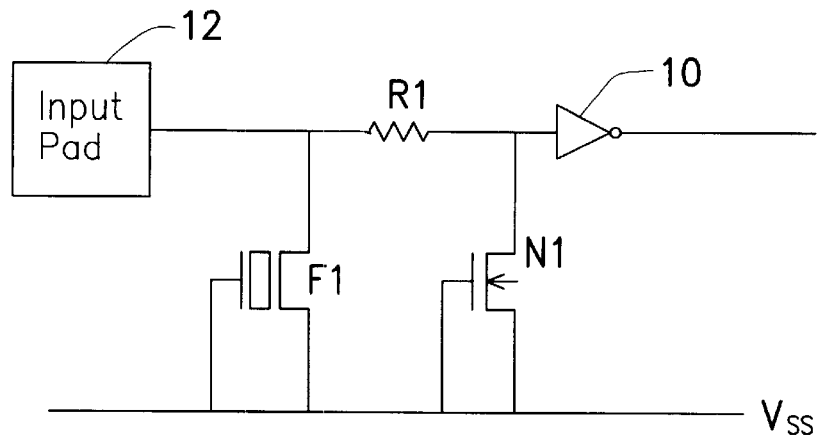
FIG. 1 is a schematic diagram of a first conventional ESD protection circuit.
Figure 2:
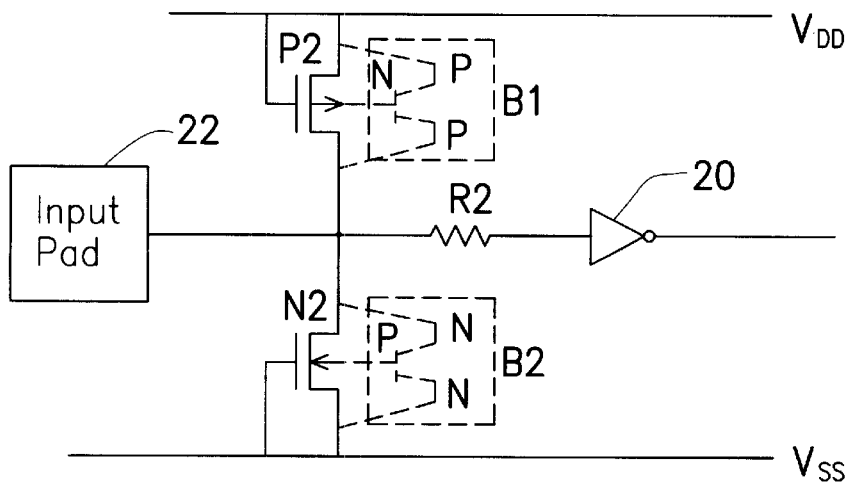
FIG. 2 is a schematic diagram of a second conventional ESD protection circuit.
Figure 3:
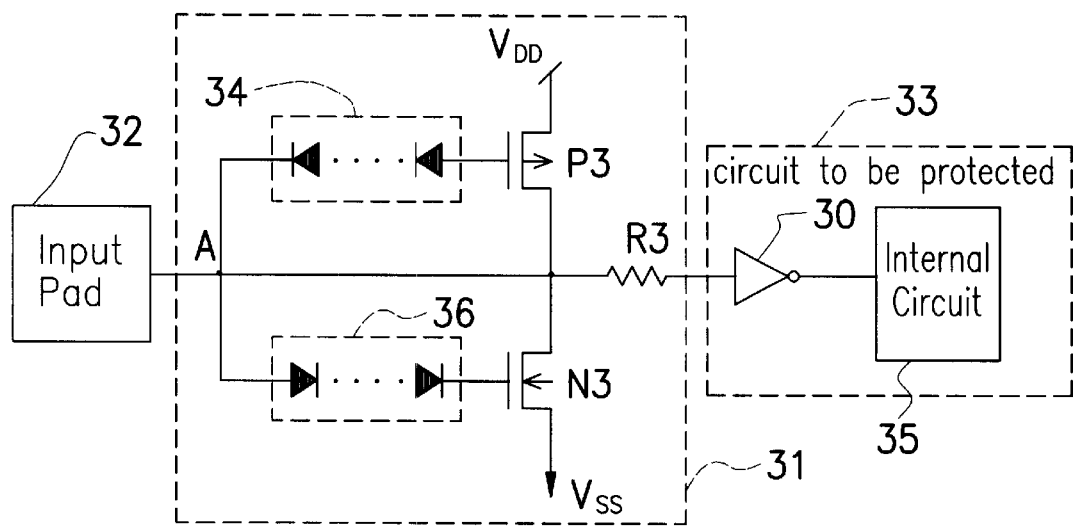
FIG. 3 is a schematic diagram of a first preferred embodiment of the ESD protection circuit according to the invention.

FIG. 3 is a schematic diagram of a first preferred embodiment of the ESD protection circuit according to the invention, which is designated by the reference numeral 31. In use, the ESD protection circuit 31 is coupled between an input pad (IP) 32 and an IC device 33. The IC device 33 includes an inverter 30 coupled to its internal circuit 35. The ESD protection circuit 31 is designed to protect the IC device 33 against ESD stress.

As shown, the ESD protection circuit 31 includes a PMOS transistor P3, an NMOS transistor N3, a resistor R3, a first potential drop subcircuit 34 composed of a plurality of serially connected diodes, and a second potential drop subcircuit 36 composed of a plurality of serially connected diodes. The PMOS transistor P3 is connected in such a manner that its source is connected to the system power line $V_{DD}$, its drain is connected to a common node A connected to the IP 32, and its gate is connected to the positive end of the first potential drop subcircuit 34. The NMOS transistor N3 is connected in such a manner that its source is connected to the ground power line $V_{SS}$, its drain is connected to the common node A, and its gate is connected to the negative end of the second potential drop subcircuit 36. The resistor R3 is connected between the common node A and the input end of the inverter 30 in the IC device 33. The first potential drop subcircuit 34 is connected between the common node A and the gate of the PMOS transistor P3, while the second potential drop subcircuit 36 is connected between the common node A and the gate of the NMOS transistor N3.

The first potential drop subcircuit 34 is composed of a plurality of diodes which are serially connected forward from the gate of the PMOS transistor P3 to the common node A. The number n of the diodes in the first potential drop subcircuit 34 is designed in such a manner as to allow all of the diodes to be conductive when a predetermined level of ESD stress appears at the common node A. An overly large negative voltage from an ESD stress applied to the IP 32 causes an abrupt change to the gate voltage at the gate of the PMOS transistor P3, thereby immediately switching the PMOS transistor P3 into the conductive state. As a result of this, even though the inverter 30 has a very low breakdown voltage due to its gate oxide layer being very thin, the ESD current from the IP 32 can be nonetheless bypassed through the PMOS transistor P3 to system power line $V_{DD}$.

Similarly, the second potential drop subcircuit 36 is composed of a plurality of diodes, which are serially connected forwardly from the node A to the gate of the NMOS transistor N3. The number m of the diodes in the second potential drop subcircuit 36 is designed in such a manner as to allow all of the diodes to be conductive when a predetermined level of ESD stress appears at the common node A. In the event that an overly large positive voltage from an ESD stress is applied to the IP 32, the ESD stress will cause an abrupt change to the gate voltage at the gate of the NMOS transistor N3. This immediately switches the NMOS transistor N3 into conductive state. As a result of this, even though the inverter 30 has a very low breakdown voltage due to its gate oxide layer being very thin, the ESD current can nonetheless bypass through the NMOS transistor N3 to the ground power line $V_{SS}$.

The upper part of the ESD protection circuit 31 is connected to the system power line $V_{DD}$. A positive ESD voltage applied to the IP 32 causes the PMOS transistor P3 to produce a parasitic diode current. In contrast, a negative ESD voltage, smaller in magnitude than the voltage at the gate of PMOS transistor, applied to the IP 32, causes all of the diodes in the first potential drop subcircuit 34 to conduct, thereby causing the PMOS transistor P3 to switch into the conductive state. As a result of this, the ESD current bypasses through the PMOS transistor P3 to the system power line $V_{DD}$.

On the other hand, the bottom part of the ESD protection circuit 31 is connected to the ground power line $V_{SS}$. A negative ESD voltage applied to the IP 32 causes the NMOS transistor N3 to produce a parasitic diode current. In contrast, a positive ESD voltage, larger in magnitude than the voltage at the gate of the NMOS transistor N3, applied to the IP 32 causes all of the diodes in the second potential drop subcircuit 36 to conduct. This causes the NMOS transistor N3 to switch into the conductive state. As a result of this, the ESD current is bypassed through the NMOS transistor N3 to the ground power line $V_{SS}$.

Figure 4:
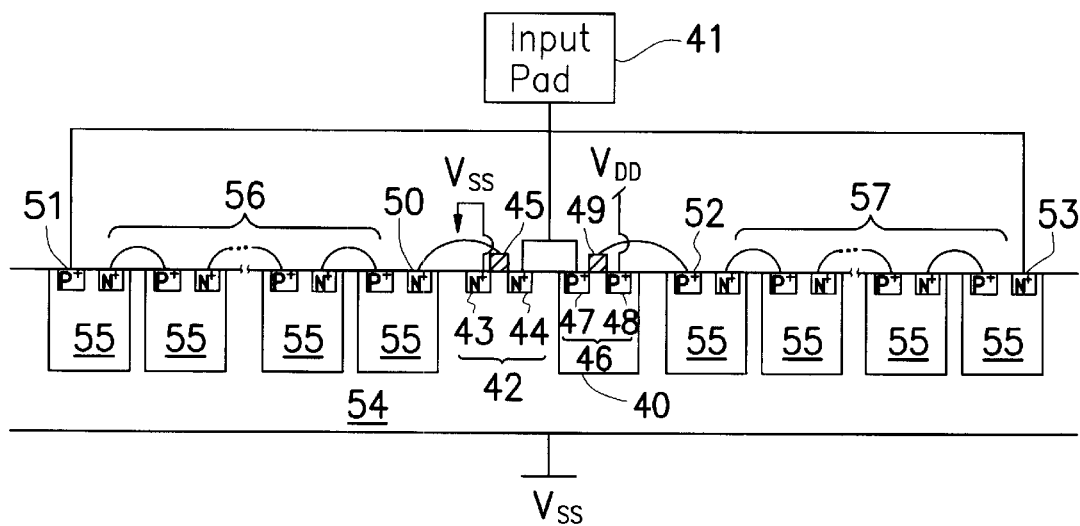
FIG. 4 is a schematic cross-sectional diagram of a semiconductor implementation of the ESD protection circuit of FIG. 3.

FIG. 4 is a schematic cross-sectional diagram showing a semiconductor implementation of the ESD protection circuit of FIG. 3. As shown, the ESD protection circuit is constructed on a P-type substrate 54 which is formed with a plurality of a first kind of N-wells 55, each of which is formed with a P⁻ region and an N⁺ region. A second kind of N-well 40 is formed with a pair of P⁺ regions. Further, the ESD protection circuit is formed with an NMOS transistor 42, which serves as the NMOS transistor N3 shown in FIG. 3, and a PMOS transistor 46, which serves as the PMOS transistor P3 shown in FIG. 3. The NMOS transistor N3 has a gate 45, an N⁺ source 43, and an N⁺ drain 44. The PMOS transistor P3 has a gate 49, a P⁺ drain 47, and a P⁺ source 48.

Those N-wells 55 on the left side of the N-well 40 (as collectively designated by the reference numeral 56 in FIG. 4) are connected in such a manner that, except for the right-most N-well in this N-well group 56, the N⁺ region of each N-well is wired to the P⁺ region of the next N-well to the right, thereby forming a group of serially-connected diodes (which serves as the second potential drop subcircuit 36 shown in FIG. 3). The P⁺ region 51 of the leftmost N-well in this N-well group 56 is connected to the IP 41 (which is the IP 32 shown in FIG. 3), while the N⁺ region of the right-most N-well in this N-well group 56 is connected to the gate 45 of the NMOS transistor 42. The N⁺ source 43 of the NMOS transistor 42 is connected to the ground power line $V_{SS}$.

On the other hand, those N-wells 55 on the right side of the N-well 40 (as collectively designated by the reference numeral 57 in FIG. 4) are connected in such a manner that, except for the left-most N-well in this N-well group 57, the P+region of each N-well is wired to the N⁺ region of the next well to the left, thereby forming a group of serially-connected diodes (which serves as the first potential drop subcircuit 34 shown in FIG. 3). The N⁺ region 53 of the rightmost N-well in this N-well group 57 is connected to the IP 41 (which is the IP 32 shown in FIG. 3), while the P⁺ region of the left-most N-well in this N-well group 57 is connected to the gate 49 of the PMOS transistor 46. The P⁺ source 48 of the PMOS transistor 46 is connected to the system power line $V_{DD}$. Further, the P⁺ drain 47 of the PMOS transistor 46 is wired to the N⁻ drain 44 of the NMOS transistor 42 and then connected together to the IP 41.

Figure 5:
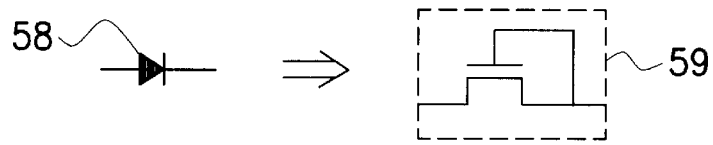
FIG. 5 is a schematic diagram used to depict the realization of a diode element by a MOS transistor having its gate tied to source or drain.

As shown in FIG. 5, in semiconductor fabrication, each diode element 58 in the first and second potential drop subcircuit 34, 36 (FIG. 3) can be realized by forming a MOS transistor 59 having its gate connected to its source or drain. Therefore, the diode elements in the first and second potential drop subcircuit 34, 36 (FIG. 3) can be implemented by forming a plurality of such MOS transistors in the P-type substrate 54 of FIG. 4 instead of the N-wells 55 with serially connected P⁺ regions and N⁺ regions.

Second Preferred Embodiment

Figure 6:
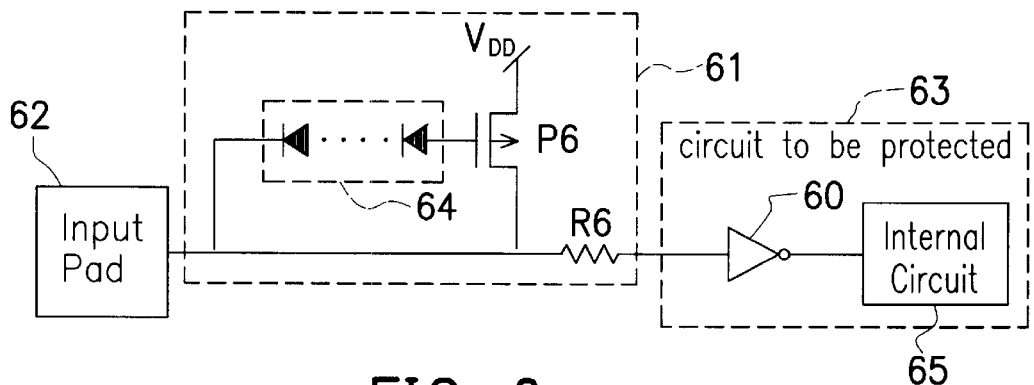
FIG. 6 is a schematic diagram of a second preferred embodiment of the ESD protection circuit according to the invention.

FIG. 6 is a schematic diagram of a second preferred embodiment of the ESD protection circuit according to the invention, which is designated here by the reference numeral 61. In use, the ESD protection circuit 61 is coupled between an input pad (IP) 62 and an IC device 63. The IC device 63 includes an inverter 60 coupled to its internal circuit 65. The ESD protection circuit 61 is designed to protect the IC device 63 against ESD stress.

As shown, the ESD protection circuit 61 includes a PMOS transistor P6 whose source is connected to the system power line VDD and whose drain is connected to the IP 62; a resistor R6 having one end connected to the IP 62 and the other end connected to the inverter 60; and a potential drop subcircuit 64 connected between the gate of the PMOS transistor P6 and the IP 62. This ESD protection circuit is structurally identical to the upper part of the ESD protection circuit of FIG. 3, and is functionally able to provide ESD protection against any negative ESD voltage being applied to the IP 62.

The operation is identical to the upper part of the ESD protection circuit of FIG. 3, so a detailed description of it will not be repeated.

Third Preferred Embodiment

Figure 7:
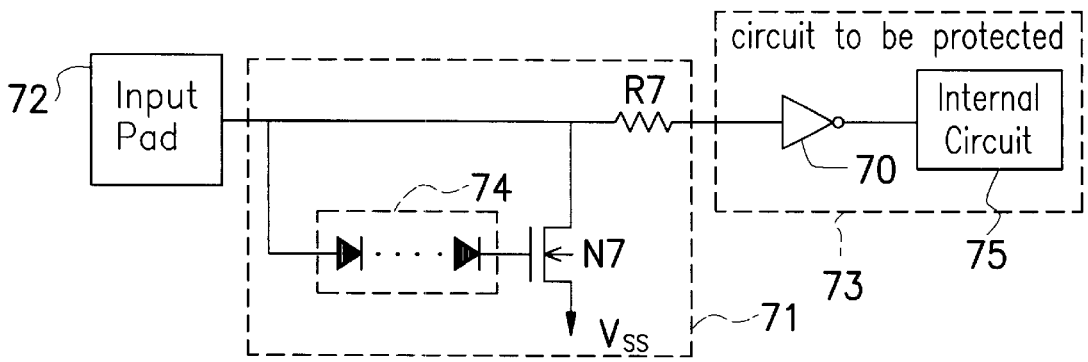
FIG. 7 is a schematic diagram of a third preferred embodiment of the ESD protection circuit according to the invention.

FIG. 7 is a schematic diagram of a third preferred embodiment of the ESD protection circuit according to the invention, which is designated here by the reference numeral 71. In design, the ESD protection circuit 71 is coupled between an input pad (IP) 72 and the protected IC device 73. The protected IC device 73 includes an inverter 70 and the internal circuit 75.

As shown, the ESD protection circuit 71 includes an NMOS transistor N7 whose source is connected to the ground power line $V_{SS}$ and whose drain is connected to the IP 72; a resistor R7 having one end connected to the IP 72 and the other end connected to the inverter 70; and a potential drop subcircuit 74 connected between the IP 72 and the gate of the NMOS transistor N7. This ESD protection circuit is structurally identical to the bottom part of the ESD protection circuit of FIG. 3, and is functionally able to provide ESD protection against any positive ESD voltage being applied to the IP 72. The operation is identical to the bottom part of the ESD protection circuit of FIG. 3, so a detailed description of it will not be repeated.

In conclusion, the invention provides an ESD protection circuit characterized by the provision of a potential drop subcircuit for controlling the switching of a MOS transistor, which is either a PMOS transistor or an NMOS transistor, connected to an ESD-absorbing power line. The potential drop subcircuit can be one or more serially connected diodes, or a plurality of serially connected MOS transistors each having its gate connected to its source or drain. The potential drop subcircuit allows the MOS transistor to be switched into conductive state so as to drain the ESD current from the ESD stress to the power line.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An ESD protection circuit coupled between an input pad and an integrated circuit device, the integrated circuit device having an inverter coupled to its internal circuit for the purpose of protecting the integrated circuit device against ESD stress, the ESD protection circuit comprising:

a resistor having a first end connected to a common node connected to the input pad and a second end connected to the input end of the inverter;

a PMOS transistor whose source is connected to a first power line and whose drain is connected to the common node;

a first potential drop subcircuit having a positive end connected to the gate of the PMOS transistor and a negative end connected to the common node, wherein the first potential drop subcircuit switches into the conductive state when a negative ESD voltage lower in magnitude than a predetermined level is applied to the input pad, causing the PMOS transistor to be switched into the conductive state, and the first potential drop subcircuit further reducing the negative ESD voltage;

an NMOS transistor whose source is connected to a second power line and whose drain is connected to the common node; and a second potential drop subcircuit having a positive end connected to the common node and a negative end connected to the gate of the NMOS transistor, wherein the second potential drop subcircuit is switched into the conductive state when a positive ESD voltage higher in magnitude than a predetermined level is applied to the input pad, causing the NMOS transistor to be switched into the conductive state, and the second potential drop subcircuit further reducing the positive ESD voltage.

2. The ESD protection circuit of claim 1, wherein the first potential drop subcircuit comprises at least one diode having a positive end connected to the gate of the PMOS transistor and a negative end connected to the common node.

3. The ESD protection circuit of claim 2, wherein the diode is formed from a MOS transistor having its gate connected to one of its source/drain electrodes.

4. The ESD protection circuit of claim 1, wherein the second potential drop subcircuit comprises at least one diode having a positive end connected to the common node and a negative end connected to the gate of the NMOS transistor.

5. The ESD protection circuit of claim 4, wherein the diode is formed from a MOS transistor having its gate connected to its source or its drain.

6. An ESD protection circuit coupling between an IP and an integrated circuit device, the integrated circuit device having an inverter coupled to its internal circuit for the purpose of protecting the integrated circuit device against ESD stress, the ESD protection circuit comprising:

a resistor having a first end connected to a common node connected to the input pad and a second end connected to the input end of the inverter;

a PMOS transistor whose source is connected to a power line and whose drain is connected to the common node; and a potential drop subcircuit having a positive end connected to the gate of the PMOS transistor and a negative end connected to the common node, wherein the potential drop subcircuit is switched into the conductive state when a negative ESD voltage lower in magnitude than a predetermined level is applied to the input pad, causing the PMOS transistor to switch into the conductive state, and the potential drop subcircuit further reduces the negative ESD voltage.

7. The ESD protection circuit of claim 6, wherein the potential drop subeircuit comprises at least one diode having a positive end connected to the gate of the PMOS transistor and a negative end connected to the common node.

8. The ESD protection circuit of claim 7, wherein the diode is formed from a MOS transistor having its gate connected to one of its source/drain electrodes.

* * * * *